(12) United States Patent
Kim et al.

(10) Patent No.: US 9,118,014 B2
(45) Date of Patent: Aug. 25, 2015

(54) DONOR SUBSTRATE FOR ORGANIC LIGHT EMITTING DIODE DISPLAY AND ORGANIC LIGHT EMITTING DIODE DISPLAY

(71) Applicant: Samsung Display Co., Ltd., Yongin, Gyeonggi-Do (KR)

(72) Inventors: Nam-Jin Kim, Yongin (KR); Chul-Hwan Park, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 0 days.

(21) Appl. No.: 13/955,159

(22) Filed: Jul. 31, 2013

(65) Prior Publication Data
US 2014/0239268 A1 Aug. 28, 2014

(30) Foreign Application Priority Data
Feb. 27, 2013 (KR) .................. 10-2013-0021527

(51) Int. Cl.
| | | |
|---|---|---|
| H01L 29/08 | (2006.01) | |
| H01L 29/04 | (2006.01) | |
| H01L 29/18 | (2006.01) | |
| H01L 33/00 | (2010.01) | |
| H01L 51/00 | (2006.01) | |
| H01L 27/32 | (2006.01) | |

(52) U.S. Cl.
CPC ........ H01L 51/0013 (2013.01); H01L 27/3246 (2013.01)

(58) Field of Classification Search
CPC ..... H01L 51/13; H01L 51/5203; H01L 51/50; H01L 27/3262; G06F 17/3082; G11B 27/11; H04N 21/84; H04N 21/278; H04N 21/4756; H04N 21/23109

USPC ............... 257/40, 59, 98, 261, 608, E25.014, 257/E27.004, 88, 79; 438/166, 34; 365/148, 365/174; 313/504

See application file for complete search history.

(56) References Cited

U.S. PATENT DOCUMENTS

| | | | |
|---|---|---|---|
| 2003/0111666 A1* | 6/2003 | Nishi et al. ...................... 257/79 |
| 2003/0146711 A1* | 8/2003 | Tsujimura et al. .......... 315/169.3 |
| 2004/0135501 A1* | 7/2004 | Nishikawa .................... 313/506 |
| 2004/0160167 A1* | 8/2004 | Arai et al. ...................... 313/500 |
| 2005/0136344 A1* | 6/2005 | Kang et al. ..................... 430/18 |
| 2007/0069639 A1* | 3/2007 | Noh et al. ..................... 313/504 |
| 2010/0171138 A1* | 7/2010 | Yamazaki et al. .............. 257/98 |

FOREIGN PATENT DOCUMENTS

| | | |
|---|---|---|
| KR | 1020070035857 | 4/2007 |
| KR | 1020070096082 | 10/2007 |
| KR | 1020110040244 | 4/2011 |

* cited by examiner

Primary Examiner — Long K Tran
Assistant Examiner — Dzung Tran
(74) Attorney, Agent, or Firm — Robert E. Bushnell, Esq.

(57) ABSTRACT

An organic light emitting diode (OLED) display device the present invention includes a substrate, a thin film transistor formed on the substrate, a pixel electrode formed on the thin film transistor and electrically connected to the thin film transistor, a pixel defining layer formed on the pixel electrode and defining a pixel area, an emission layer formed on the pixel electrode and contacting the pixel electrode in the pixel area, and an intermediate layer formed on the pixel defining layer and contacting a portion of the emission layer.

18 Claims, 7 Drawing Sheets

DONOR SUBSTRATE FOR ORGANIC LIGHT EMITTING DIODE DISPLAY AND ORGANIC LIGHT EMITTING DIODE DISPLAY

CLAIM OR PRIORITY

This application claims priority under 35 U.S.C. §119 of Korean Patent Application No. 10-2013-0021527 filed in the Korean Intellectual Property Office on Feb. 27, 2013, the entire contents of which are incorporated herein by reference.

BACKGROUND OF THE INVENTION

1. Field of the Invention

The present invention generally relates to an organic light emitting diode (OLED) display device, a method of manufacturing the same, and a donor substrate used to manufacturing the organic light emitting diode (OLED) display device, and more particularly, to an organic light emitting diode (OLED) display device having an organic emission layer transferred from a donor substrate and a method of manufacturing the same.

2. Description of the Related Art

An organic light emitting element used for a flat panel display includes an anode, a cathode, and organic films provided between the anode and the cathode. The organic films include an emission layer, a hole injection layer (HIL), a hole transport layer (HTL), an electron transport layer (ETL), and an electron injection layer (EIL). The organic light emitting element is classified as a polymer organic light emitting element and a small molecular organic light emitting element depending on a material that forms the organic film, particularly, the emission layer.

In order for the organic light emitting element to realize full colors, the organic films must be patterned. The patterning methods include a method of using a shadow mask in the case of the small molecular organic light emitting element. A laser induced thermal imaging (LITI) method by ink-jet printing or laser beams is used in the case of the organic light emitting element.

The LITI method has a merit of minutely patterning the organic film, and it is advantageously a dry process while the ink-jet printing is a wet process.

A method for forming a pattern of a polymer organic film according to the LITI method requires a light source, an acceptor substrate, and a donor film. The acceptor substrate is a display substrate on which the organic film will be formed, and the donor film includes a base film, a light-to-heat conversion layer, and a transfer layer made of an organic film.

The organic film is patterned on the acceptor substrate when laser beams output by a light source are absorbed into the light-to-heat conversion layer of the donor film and are then changed into heat energy, and the organic film forming the transfer layer is transferred to the acceptor substrate by the heat energy.

However, in the transferring process, a portion of the organic layer to be transferred to the substrate by the irradiation of the laser may not be transferred and remains to the transfer layer.

The above information disclosed in this Background section is only for enhancement of understanding of the background of the invention and therefore it may contain information that does not form the prior art that is already known in this country to a person of ordinary skill in the art.

SUMMARY OF THE INVENTION

An embodiment of the present invention provides an organic light emitting diode (OLED) display and a manufacturing method of depositing a transfer layer of a transfer region of a donor substrate while being completely separated from the peripheral transfer layer near the transfer region in a process of forming an organic emission layer by thermal transferring.

Another embodiment of the present invention provides a donor substrate transferring the transfer layer of the transfer region while being completely separated from the transfer layer near the transfer region.

An organic light emitting diode (OLED) display according to an embodiment of the present invention includes a substrate, a thin film transistor formed on the substrate, a pixel electrode formed on the thin film transistor and electrically connected to the thin film transistor, a pixel defining layer formed on the pixel electrode and defining a pixel area, an emission layer formed on the pixel electrode and contacting the pixel electrode in the pixel area, and an intermediate layer formed on the pixel defining layer and contacting a portion of the emission layer.

The intermediate layer may be made of an adhesive material.

The intermediate layer may be made of a heat-hardening material or a light-hardening material.

The intermediate layer may be an attachable/detachable material.

The intermediate layer may be formed according to the edge of the emission layer.

The intermediate layer may be formed with a ring shape.

The emission layer may cover the intermediate layer and the pixel electrode of the pixel area.

The emission layer may cover a portion of the intermediate layer.

The intermediate layer may cover a portion of the pixel defining layer.

A manufacturing method of an organic light emitting diode (OLED) display according to an embodiment of the present invention includes forming a thin film transistor on a substrate, forming a pixel electrode electrically connected to the thin film transistor on the thin film transistor, forming a pixel defining layer defining a pixel area on the pixel electrode, forming an intermediate layer on the pixel defining layer, and forming an emission layer contacting the pixel electrode in the pixel area and covering the pixel electrode and the intermediate layer.

In the formation of the emission layer, the emission layer may cover a portion of the intermediate layer.

The formation of the emission layer may include disposing a donor substrate in which a transfer layer for forming the emission layer is formed at one surface on the pixel area, and transferring the transfer layer on the pixel area.

In the formation of the intermediate layer, an adhesive material or an attachable/detachable material may be positioned according to the edge of the emission layer under the transfer layer and is transferred onto the pixel defining layer along with the transfer layer.

The transfer layer may cover the pixel electrode and the intermediate layer.

The intermediate layer may cover a portion of the pixel defining layer.

A donor substrate for transferring a transfer material to a pixel area defined by a pixel defining layer of an organic light emitting diode (OLED) display according to an embodiment of the present invention includes a base layer, a light-to-heat conversion layer formed on the base member, a transfer layer formed on the light-to-heat conversion layer and made of an organic emission layer, and an adhesive layer formed on the transfer layer and including an opening of a shape corresponding to the pixel area.

The opening may be equal to or larger than an area of the pixel area.

The adhesive layer may be formed of a ring shape.

The adhesive layer may be made of an adhesive material.

The adhesive layer may be made of a heat-hardening material or a light-hardening material.

The adhesive layer may be formed of an attachable/detachable material.

In the organic light emitting diode (OLED) display according to an embodiment of the present invention, the transfer layer of the donor substrate irradiated by a laser is completely separated from the donor substrate thereby forming the organic emission layer.

The manufacturing method of the organic light emitting diode (OLED) display according to another embodiment of the present invention may prevent a defect that the transfer layer of the transfer region irradiated by the laser partially remains on the donor substrate.

In the donor substrate according to another embodiment of the present invention, the transfer layer of the transfer region irradiated by the laser is completely separated such that the defect that the transfer layer partially remains may be prevented.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE EMBODIMENTS

Figure 1:
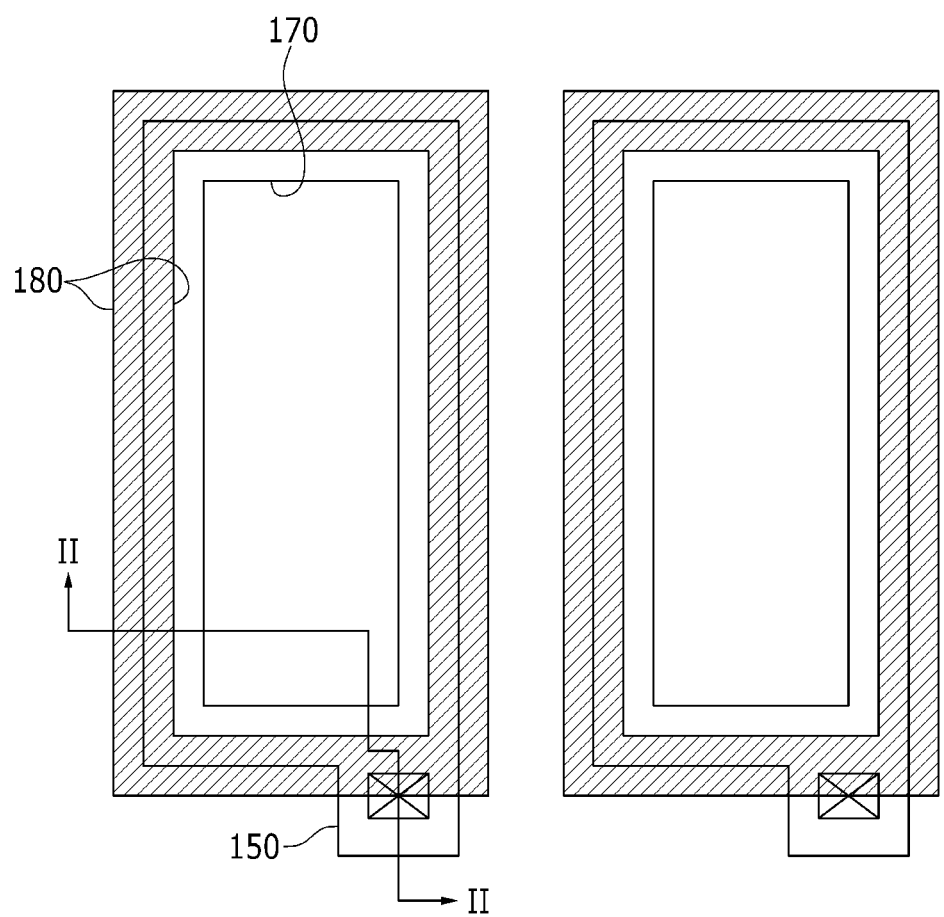
FIG. 1 is a top plan view of an organic light emitting diode (OLED) display constructed as an embodiment according to the principles of the present invention.

Hereinafter, exemplary embodiments of the present invention will be described in detail with reference to the accompanying drawings so that those skilled in the art to which the present invention pertains can realize the present invention. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, description of an upper part of a target portion indicates an upper part or a lower part of the target portion, and it does not mean that the target portion is always positioned at the upper side based on a gravity direction.

Figure 2:
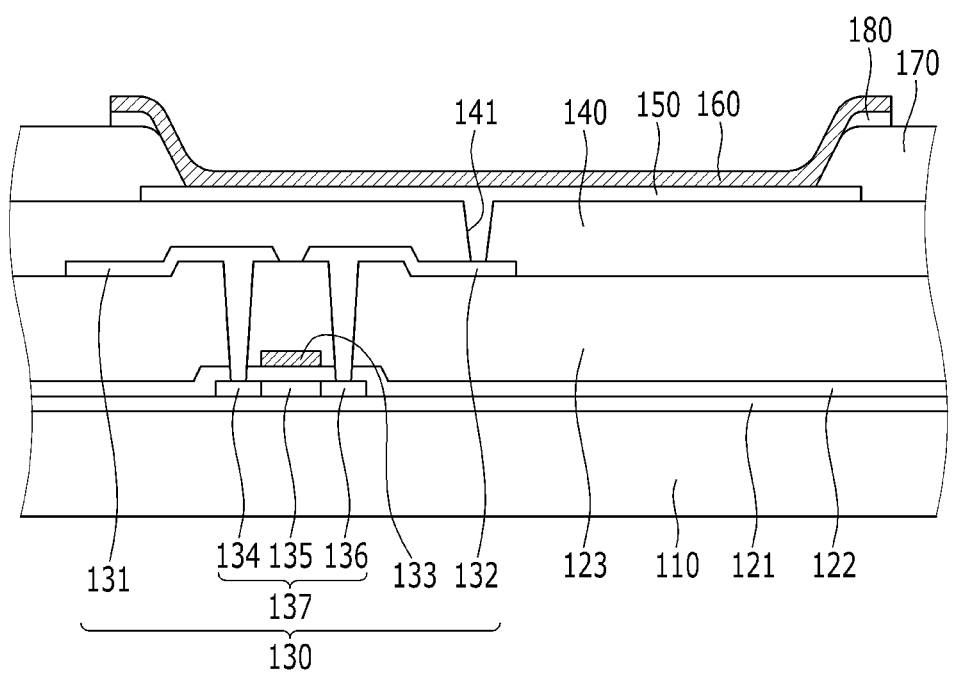
FIG. 2 is a cross-sectional view taken along line II-II of FIG. 1.

FIG. 1 is a top plan view of an organic light emitting diode (OLED) display constructed as an embodiment according to the principles of the present invention. FIG. 2 is a cross-sectional view taken along line II-II of FIG. 1. Referring to FIG. 1 and FIG. 2, in an organic light emitting diode (OLED) display constructed as an embodiment according to the principles of the present invention, a transfer layer of a donor substrate irradiated by a laser is completely separated from a donor substrate thereby forming an organic emission layer.

The organic light emitting diode (OLED) display constructed as an embodiment according to the principles of the present invention includes a substrate 110, a thin film transistor 130, a pixel electrode 150, a pixel defining layer 170, an emission layer 160, and an intermediate layer 180.

Next, a structure of the organic light emitting diode (OLED) display according to an embodiment of the present invention will be described according to a deposition sequence with reference to FIG. 1. Here, the structure of the organic light emitting diode (OLED) display is a structure of a driving thin film transistor and an emission layer light-emitted by the driving thin film transistor.

At this time, the substrate 110 is formed of an insulating substrate composed of glass, quartz, ceramic, plastic, and the like. However, the present invention is not limited thereto, and the substrate 110 may also be formed as a metallic substrate composed of stainless steel and the like.

A buffer layer 121 is formed on the substrate 110. The buffer layer 121 serves to prevent impure elements from penetrating the surface thereof and planarizes it.

The buffer layer 121 may be formed of various materials capable of serving the role. As an example, any one of a silicon nitride (SiNx) layer, a silicon oxide (SiO2) layer, and a silicon oxynitride (SiOxNy) layer may be used as the buffer layer 121. However, the buffer layer 121 is not always a necessary configuration, and may be omitted according to a kind and process condition of the display substrate 110.

A driving semiconductor layer 137 is formed on the buffer layer 121. The driving semiconductor layer 137 may be a polysilicon film. The driving semiconductor layer 137 includes a channel area 135 in which impurities are not doped, and a source area 134 and a drain area 136 which are doped and formed at opposite sides of the channel area 135. In this case, the ionic material to be doped is a p-type impurity such as boron (B), and $B_2H_6$ is mainly used. Here, the impurity may be changed according to a kind of the thin film transistor.

A gate insulating layer 122 formed of silicon nitride (SiNx) or silicon oxide (SiO2) is formed on the driving semiconductor layer 137. Gate wiring including a driving gate electrode 133 is formed on the gate insulating layer 122. In addition, the driving gate electrode 133 is formed to be overlapped with at least a part of the driving semiconductor layer 137, particularly, the channel area 135.

An interlayer insulating layer 123 covering the driving gate electrode 133 is formed on the gate insulating layer 122. The gate insulating layer 122 and the interlayer insulating layer 123 together have through holes exposing the source area 134 and the drain area 136 of the driving semiconductor layer 137. The interlayer insulating layer 123 is prepared by using a ceramic-series material such as silicon nitride (SiNx), silicon oxide (SiO2), or the like as in the gate insulating layer 122.

Data wiring including a driving source electrode 131 and a driving drain electrode 132 is formed on the interlayer insulating layer 123. In addition, the driving source electrode 131 and the driving drain electrode 132 are respectively connected to the source area 134 and the drain area 136 of the driving semiconductor layer 137 via through holes formed in the interlayer insulating layer 123 and the gate insulating layer 122.

The driving thin film transistor 130 including the driving semiconductor layer 137, the driving gate electrode 133, the driving source electrode 131, and the driving drain electrode 132 is formed as described above. The configuration of the driving thin film transistor 130 is not limited to the above-described example, and may be variously changed into a known configuration which may be easily performed by those skilled in the art.

A planarization layer 140 covering the data wiring is formed on the interlayer insulating layer 123. The planarization layer 140 serves to eliminate and planarize a step difference in order to increase the light emitting efficiency of the organic light emitting element to be formed thereon. In addition, the planarization layer 140 has an electrode contact hole 141 exposing a part of the drain electrode 132.

The planarization layer 140 may be prepared with one or more materials such as acryl-based resins, epoxy resins, phenolic resins, polyamide-based resins, polyimide-based resins, unsaturated polyester-based resins, polyphenylenether-based resins, polyphenylenesulfide-based resins, and benzocyclobutene (BCB).

Further, the embodiment according to the present invention is not limited to the above-described structure, and one of the planarization layer 140 and the interlayer insulating layer 123 may be omitted in some cases.

The pixel electrode 150 of the organic light emitting element is formed on the planarization layer 140. That is, the organic light emitting diode (OLED) display includes a plurality of pixel electrodes 150 respectively disposed for a plurality of pixels. Here, the plurality of pixel electrodes 150 are separated from each other. Each pixel electrode 150 is connected to a drain electrode 132 through an electrode contact hole 141 of the planarization layer 140.

In addition, the pixel defining layer 170 having an opening that exposes the pixel electrode 150 is formed on the planarization layer 140. That is, the pixel defining layer 170 has a plurality of openings that are individually formed for each pixel. An emission layer 160 may be formed for each opening formed by the pixel defining layer 170. Accordingly, a pixel area in which each emission layer is formed may be defined by the pixel defining layer 170.

In addition, the pixel electrode 150 is disposed so as to correspond to the opening of the pixel defining layer 170. However, the pixel electrode 150 can be disposed under the pixel defining layer 170 to be partially overlapped by the pixel defining layer 170.

The pixel defining layer 170 can be made of an inorganic material of a resin or silica group such as a polyacrylate resin and a polyimide.

Meanwhile, the emission layer 160, in detail, an organic emission layer 160, is formed on the pixel electrode 150. Also, a common electrode (not shown) may be formed on the organic emission layer 160. As described above, the organic light emitting element including the pixel electrode 150, the organic emission layer 160, and a common electrode is formed.

The organic emission layer 160 is made of a low-molecular organic material or a high-molecular organic material. The organic emission layer 160 is formed in a multi-layer structure including a hole injection layer (HIL), a hole transport layer (HTL), an emission layer, an electron transport layer (ETL), and an electron injection layer (EIL). When including all of these, the HIL is disposed on the pixel electrode 150 which is a positive electrode, and the HTL, the emission layer, the ETL, and the EIL are sequentially stacked thereon.

At this time, the pixel electrode 150 and the common electrode may be respectively formed of a transparent conductive material, or may be formed of a semitransparent or reflective conductive material. The organic light emitting diode (OLED) display may be a top emission type, a bottom emission type, or a both-side emission type according to the kind of the materials that form the pixel electrode 150 and the common electrode.

On the other hand, an encapsulation substrate (not shown) may be disposed on the common electrode. The encapsulation substrate may be formed of a transparent material such as glass or plastic in the case of the top emission type or the both-side emission type, and it may be formed of an opaque material such as a metal in the case of the bottom light emission type.

Referring to FIG. 1 and FIG. 2, in the organic light emitting diode (OLED) display constructed as an embodiment according to the principles of the present invention, an intermediate layer 180 is formed on the pixel defining layer 170. The intermediate layer 180 contacts a portion of the organic emission layer 160 formed on the pixel electrode 150.

In detail, as shown in FIG. 2, the edge portion of the organic emission layer 160 is positioned on the intermediate layer 180. The edge of the organic emission layer 160 is positioned to cover the entirety or a portion of the intermediate layer 180. Accordingly, the organic emission layer 160 is formed to cover the pixel electrode 150 and the intermediate layer 180 that are exposed by the pixel defining layer 170.

Referring to FIG. 1, the intermediate layer 180 may have a ring shape according to the edge of the emission layer 160.

On the other hand, the intermediate layer 180 may be formed to cover the portion of the pixel defining layer 170. That is, as shown in FIG. 2, the intermediate layer 180 may overlap the portion of the pixel defining layer 170. However, it is not limited thereto, and the intermediate layer 180 may cover the entire pixel defining layer 170. According to an embodiment of the present invention, the intermediate layer 180 completely separates the transfer layer of the transfer region transferred by laser from the peripheral transfer layer near the transfer region. The detailed description for this will be given in a manufacturing method of the organic light emitting diode (OLED) display as another embodiment of the present invention.

The intermediate layer 180 is made of a material having adhesion force or attachable/detachable force. That is, the intermediate layer 180 is made of an adhesive or an attachable/detachable material. When the intermediate layer 180 is made of an attachable/detachable material, the intermediate layer 180 may be first detached from a temporary layer (not shown) which the intermediate layer 180 is originally attached to, and then, the detached intermediate layer 180 is disposed between an overlapped portion of the pixel defining layer 170 and the emission layer 160 to attach the pixel defining layer 170 and the emission layer 160 to each other.

When the intermediate layer 180 is formed of an adhesive material, it may be formed of a heat-hardening or light-hardening material. The heat-hardening material adheres, that is, joins two layers that are respectively disposed on opposite sides of the heat-hardening material to each other after the heat-hardening material is cured by heat. The light-hardening material adheres, that is, joins two layers that are respectively disposed on opposite sides of the light-hardening material to each other after the light-hardening material is cured by light, for example, by ultraviolet (UV) light. Also, the intermediate layer 180 may be formed of various adhesive materials that may be used as an adhesive. In the transferring process, the edge of the transfer layer in the transfer region is adhered or attached to the intermediate layer 180 such that the transfer layer may be completely separated from the peripheral transfer layer near the transfer region.

Figure 3:
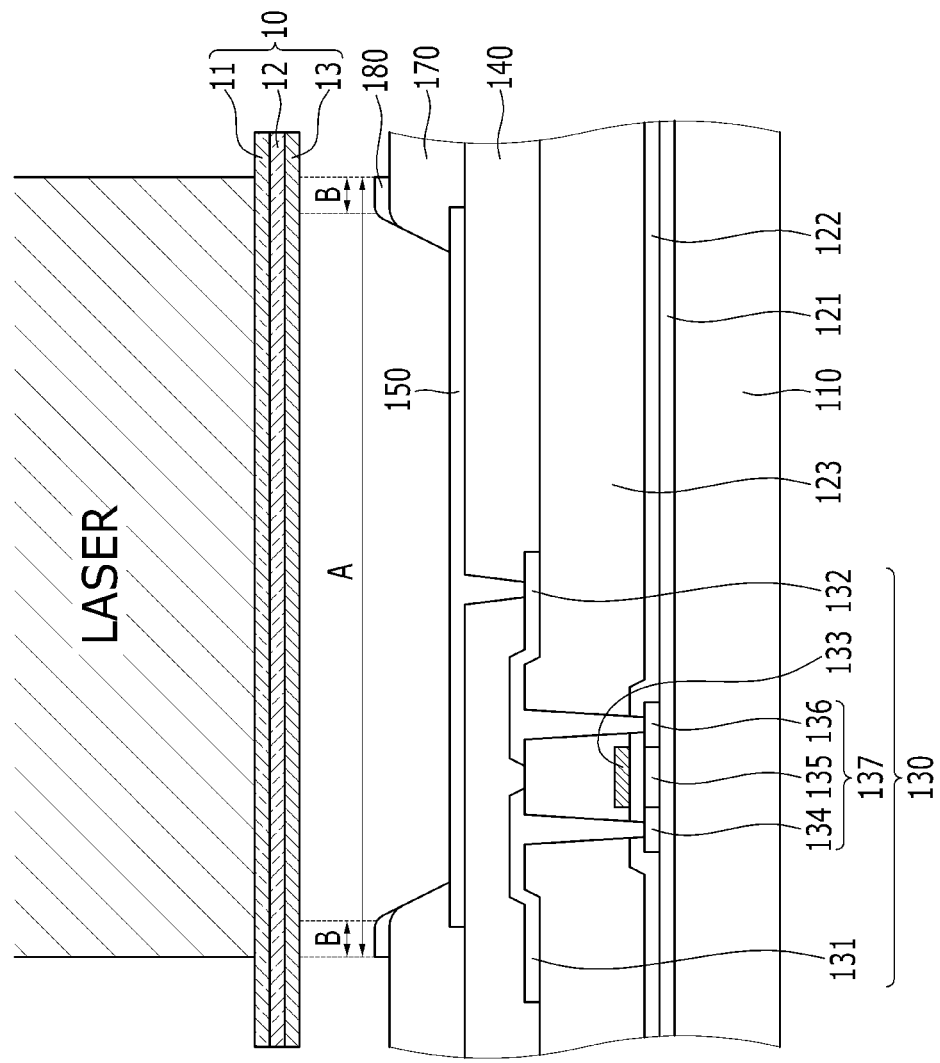
FIG. 3 to FIG. 5 are views sequentially showing a manufacturing method of an organic light emitting diode (OLED) display constructed as an embodiment according to the principles of the present invention.
Figure 4:
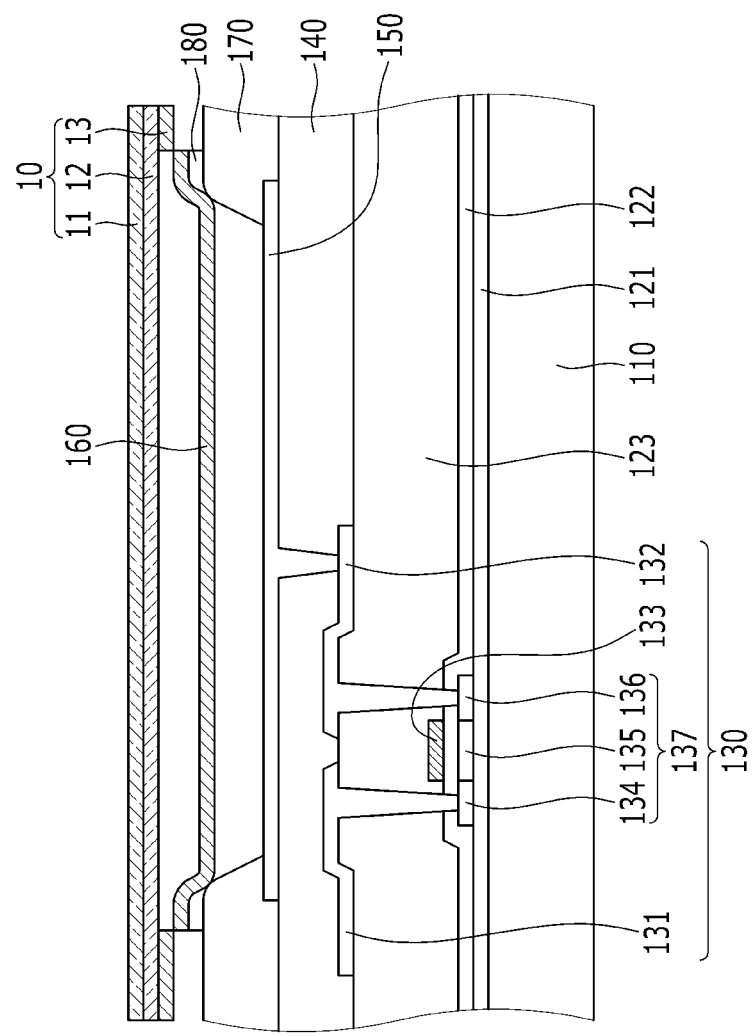
Figure 5:
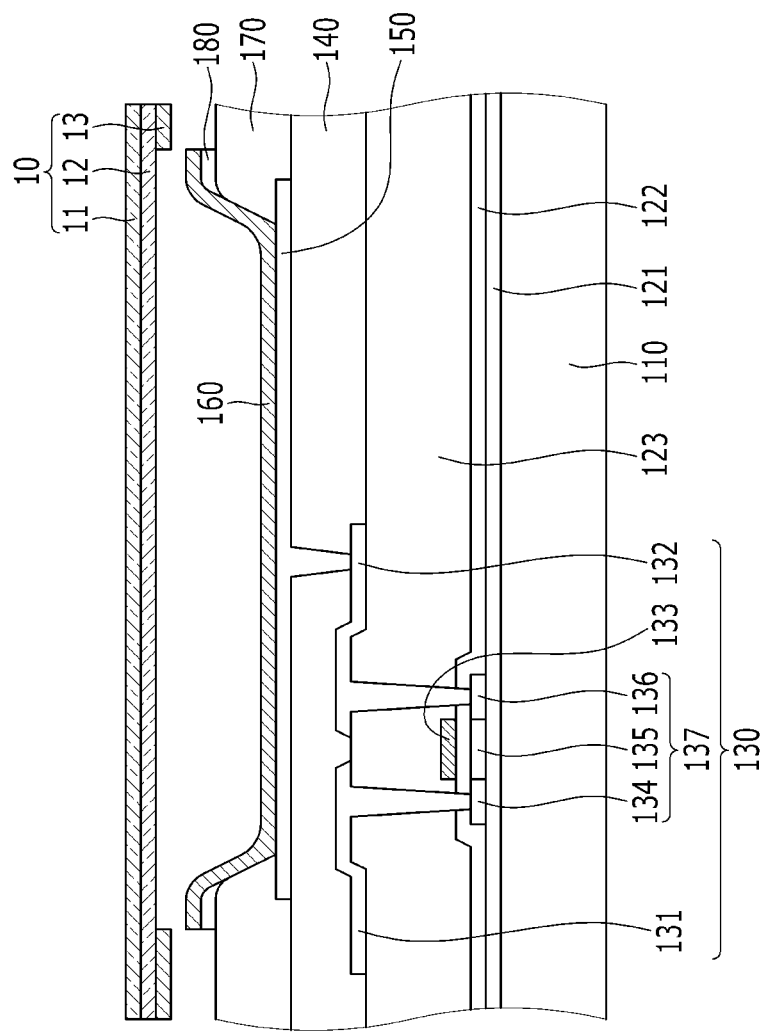

FIG. 3 to FIG. 5 are views sequentially showing a manufacturing method of an organic light emitting diode (OLED) display according to another embodiment of the present invention.

In the manufacturing method of the organic light emitting diode (OLED) display according to the current embodiment of the present invention, in the manufacturing process of the organic light emitting diode (OLED) display, a transfer layer 13 of a transfer region "A" transferred by the laser is completely separated from the periphery of the transfer layer 13 near the transfer region "A" and is deposited at the pixel area on the display substrate. That is, the manufacturing method of the organic light emitting diode (OLED) display according to the current embodiment of the present invention prevents the transfer layer from remaining inside the transfer region "A" of the donor substrate.

Firstly, referring to FIG. 3, a thin film transistor is formed on the substrate 110. The thin film transistor may include the described driving thin film transistor 130 and a switching thin film transistor (not shown). The process of forming the thin film transistor on the substrate 110 uses the formation process of the disclosed thin film transistor and the detailed description thereof is omitted.

Next, a pixel electrode 150 is formed on the thin film transistor. In detail, as shown in FIG. 3, the pixel electrode 150 is formed to be electrically connected to the drain electrode 132 of the thin film transistor.

Next, the pixel defining layer 170 is formed on the pixel electrode 150. The pixel defining layer 170 defines the pixel area in which the organic light emitting element is disposed. The pixel defining layer 170 has an opening exposing the pixel electrode 150.

Also, after forming the pixel defining layer 170, the intermediate layer 180 is formed on the pixel defining layer 170. The intermediate layer 180 may be formed on pixel defining layer 170 by using a mask. The mask may be an exposure mask or a fine metal mask (FMM). Also, the mask must have an opening to form the intermediate layer 180.

However, it is not limited to the intermediate layer 180 being formed directly on the pixel defining layer 170, and after positioning an adhesive material or an attachable/detachable material under the transfer layer 13 of a donor substrate 10, the transfer layer and the adhesive material or the adhesive material are transferred thereby forming the intermediate layer. Also, the intermediate layer may be formed by using a donor substrate 300 according to another embodiment of the present invention that will be described later. As a result, an adhesive layer 340 of the donor substrate 300 of FIG. 6 and FIG. 7 may be used to form the intermediate layer.

As shown in FIG. 1 and FIG. 2, the intermediate layer 180 may be formed to cover the portion of the pixel defining layer 170. That is, the intermediate layer 180 may be formed to overlap the portion of the pixel defining layer 170. However it is not limited thereto, and the intermediate layer 180 may be formed to cover the entire pixel defining layer 170.

At this time, the intermediate layer 180 is made of a material having a predetermined adhesion force or a predetermined attachable/detachable force. That is, the intermediate layer 180 may be made of the adhesive material or the attachable/detachable material.

When the intermediate layer 180 is formed of an adhesive material, the intermediate layer 180 may be formed of a heat-hardening or a light-hardening material. In the transferring process, the edge of the transfer layer in the transfer region is adhered or attached to the intermediate layer 180 such that the transfer layer may be completely separated from the peripheral transfer layer near the transfer region.

Next, in the pixel area, the organic emission layer 160 covering the pixel electrode 150 and the intermediate layer 180 is formed. As shown in FIG. 5, the organic emission layer 160 is disposed to overlap the pixel electrode 150 and the intermediate layer 180 exposed through the opening of the pixel defining layer 170.

At this time, the forming of the emission layer 160 includes disposing the donor substrate 10 on the pixel area and transferring a transfer material forming the transfer layer 13 from the donor substrate 10 on the pixel area. The forming of the emission layer 160 will be described with reference to FIG. 3 to FIG. 5.

As shown in FIG. 3, the donor substrate 10 includes a base layer 11, the transfer layer 13, and a light-to-heat conversion layer 12 interposed between the base layer 11 and the transfer layer 13. The base layer 11 must have transparency to transmit light to the light-to-heat conversion layer 12. For example, the base layer 11 is made of at least one polymer material selected from polyester, polyacryl, polyepoxy, polyethylene, polystyrene, and polyethylene terephthalate, or of glass.

Meanwhile, the light-to-heat conversion layer 12 absorbs light in a range from infrared rays to visible rays and partially converts the light into heat. The light-to-heat conversion layer 12 desirably includes a light absorbing material.

The light-to-heat conversion layer 12 is a metal film made of Al, Ag, or their oxides and sulfides, or an organic film made of a polymer including carbon black, graphite, or an infrared dye. The light-to-heat conversion layer 12 may be formed by using vacuum deposition, electron beam deposition, or sputtering. Also, the light-to-heat conversion layer 12 may be formed by using a disclosed coating method such as roll coating which is a general film coating method, gravure coating, extrusion coating, spin coating, or knife coating.

The transfer layer 13 may be separated from the donor substrate 10 by heat energy transmitted from the light-to-heat conversion layer 12. The transfer layer 13 may form the organic emission layer of the organic light emitting diode (OLED) display. Here, the organic emission layer is the organic light emitting element that is formed in the opening of the pixel defining layer in which the pixel electrode is exposed.

The transfer layer 13 is the hole injection layer (HIL), the hole transport layer (HTL), the emission layer, the hole suppress layer, the electron transport layer (ETL), or the electron transport layer (ETL) of the organic light emitting element, or a multilayer including two or more layers among them. Accordingly, the transfer layer 13 may include any of materials disclosed for forming the organic layer of the organic light emitting element.

In the step forming the emission layer 160, as shown in FIG. 3, donor substrate 10 is disposed on the pixel area. At this time, the donor substrate 10 is disposed such that an edge "B" of the transfer region "A" of the donor substrate 10 overlaps the intermediate layer 180. Here, the transfer region "A" is an area where the transfer layer 13 is transferred to the pixel area from the donor substrate 10 by irradiation of the laser.

The edge "B" of the transfer region "A" may overlap a portion or the entirety of an upper surface of the intermediate layer 180. As a result, the edge "B" of the transfer layer 13 that is transferred may overlap the upper surface of the intermediate layer 180.

Here, the transfer layer 13 of the donor substrate 10 and the intermediate layer 180 may be disposed to be separated by a predetermined distance. The separation distance of the transfer layer 13 and the intermediate layer 180 is a distance that the transfer layer 13 may be bent in the direction of the lower side for the edge "B" of the transfer layer 13 to contact the intermediate layer 180.

Next, the laser is irradiated to the transfer region "A" of the donor substrate 10. If the laser is irradiated to the donor substrate 10, the light-to-heat conversion layer 12 of the donor substrate 10 is expanded when the temperature of the light-to-heat conversion layer 12 increases as a result of light-to-heat conversion. Accordingly, the transfer layer 13 disposed under the light-to-heat conversion layer 12 is bent to the lower side by a volume that the light-to-heat conversion layer 12 is expanded.

At this time, the edge "B" of the transfer region "A" contacts the intermediate layer 180. If the transfer layer 13 contacts the intermediate layer 180 at the edge "B" of the transfer region "A", the transfer layer 13 of the transfer region "A" is completely separated from the donor substrate 10 by the adherence of the intermediate layer 180.

In detail, the separation is not completed by self cohesion of the transfer layer at a boundary surface of the transfer region "A" at which the transfer layer 13 is separated. However, by adhering the edge "B" of the transfer region "A" to the intermediate layer 180, the transfer region "A" of the transfer layer 13 is completely separated from the peripheral transfer layer 13 near the transfer region "A" by the adherence. Accordingly, at the edge "B" of the transfer region "A", the uncompleted separation from the periphery of the transfer layer 13 may be reduced.

The transfer layer 13 that is separated from the donor substrate 10 and transferred in the pixel area forms the organic emission layer 160 of the organic light emitting diode (OLED) display. Also, the transfer layer 13 is formed of the transferring material and the transferring material is deposited in the pixel area thereby forming the organic emission layer 160. The transferring material forming the transfer layer 13 may be an organic material.

As described above, as shown in FIG. 5, the organic emission layer 160 covers the pixel electrode 150 and the intermediate layer 180. The organic emission layer 160 may only cover a portion of the intermediate layer 180.

Figure 6:
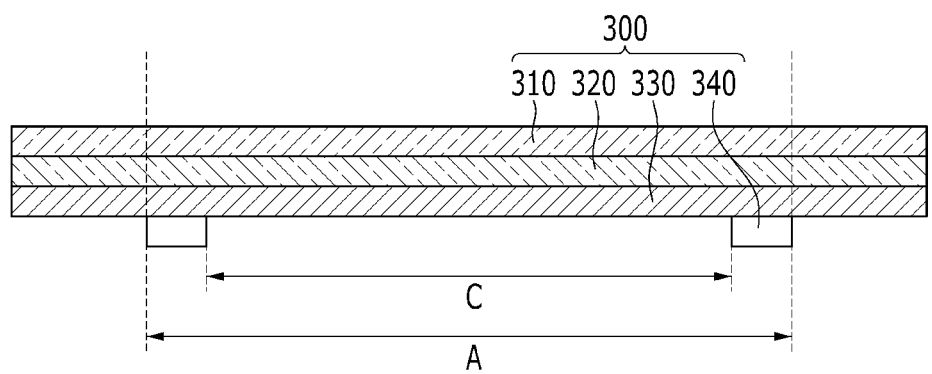
FIG. 6 is a cross-sectional view of a donor substrate according to another embodiment of the present invention.
Figure 7:
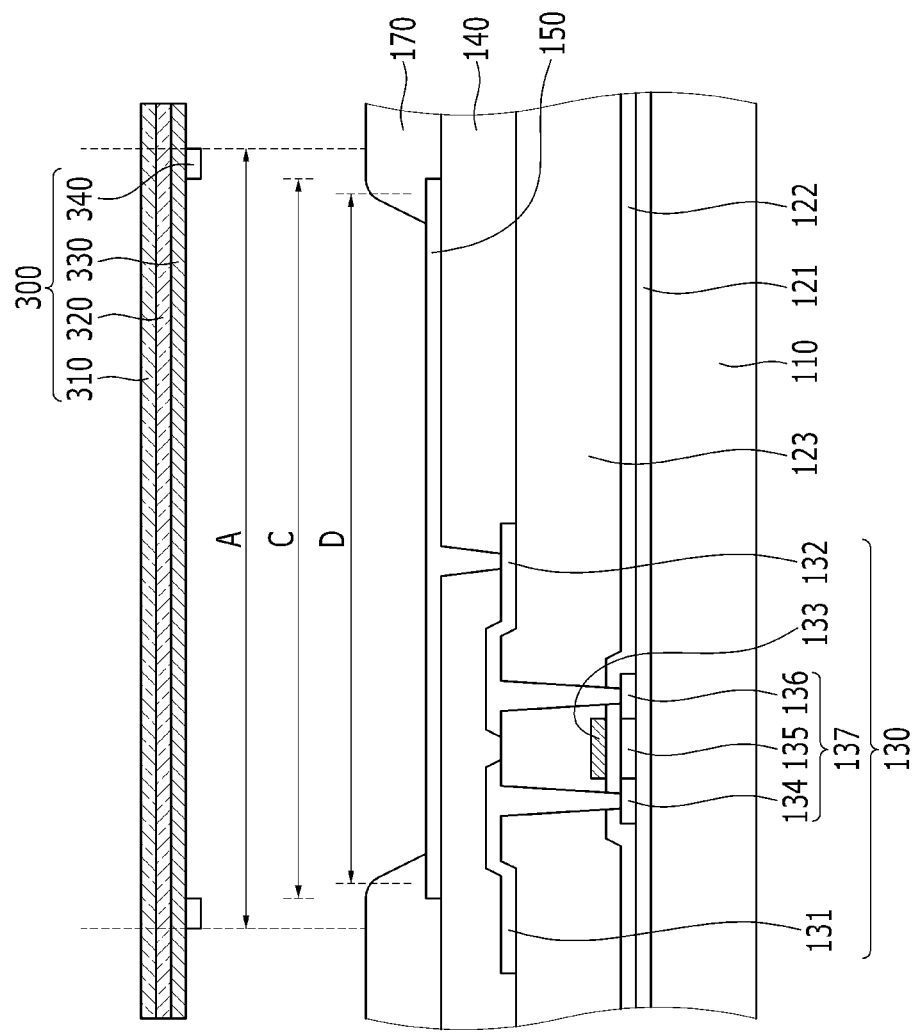
FIG. 7 is a view showing a process of transferring a transfer layer from the donor substrate of FIG. 6.

FIG. 6 and FIG. 7 relate to the donor substrate according to another embodiment of the present invention, and the donor substrate 300 correctly separating from the transfer layer 330 in the transfer region "A" from a peripheral transfer layer 330 near the transfer region "A" will be described below.

Referring to FIG. 6, a donor substrate 300 according to another embodiment of the present invention includes a base layer 310, a light-to-heat conversion layer 320, the transfer layer 330, and the adhesive layer 340.

The base layer 310, the light-to-heat conversion layer 320, the transfer layer 330, and the adhesive layer 340 are sequentially stacked to form the donor substrate 300.

The base layer 310 must have transparency to transmit light to the light-to-heat conversion layer 320. For example, the base layer 310 is made of at least one polymer material selected from polyester, polyacryl, polyepoxy, polyethylene, polystyrene, and polyethylene terephthalate, or of glass.

Meanwhile, the light-to-heat conversion layer 320 absorbs light in a range from infrared rays to visible rays and partially converts the light into heat. The light-to-heat conversion layer 320 desirably includes a light absorbing material.

The light-to-heat conversion layer 320 is a metal film made of Al, Ag, or their oxides and sulfides, or an organic film made of a polymer including carbon black, graphite, or an infrared dye. The light-to-heat conversion layer 320 may be formed by using vacuum deposition, electron beam deposition, or sputtering. Also, the light-to-heat conversion layer 320 may be formed by using a disclosed coating method such as roll coating which is a general film coating method, gravure coating, extrusion coating, spin coating, or knife coating.

The transfer layer 330 may be separated from the donor substrate 300 by heat energy transmitted from the light-to-heat conversion layer 320. The transfer layer 330 may form the organic emission layer of the organic light emitting diode (OLED) display. Here, the organic emission layer is the organic light emitting element that is formed in the opening of the pixel defining layer in which the pixel electrode is exposed.

The transfer layer 330 is the hole injection layer (HIL), the hole transport layer (HTL), the emission layer, the hole suppress layer, the electron transport layer (ETL), or the electron transport layer (ETL) of the organic light emitting element, or a multilayer including two or more layers among them. DeletedTexts Accordingly, the transfer layer 330 may include any of materials disclosed for forming the organic layer of the organic light emitting element.

According to an embodiment of the present invention, the adhesive layer 340 is formed on the transfer layer 330. The adhesive layer 340 functions to have the transfer layer 330 of the transfer region "A" completely separated from the transfer layer 330 near the transfer region "A" and transferred to the pixel area "D".

As described above, the transfer layer 330 of the transfer region "A" may be completely separated from the donor substrate 300 by the adherence of the adhesive layer 340.

In detail, the separation is not completed by self cohesion of the transfer layer in a boundary surface of the transfer region "A" in which the transfer layer 330 is separated. However, by adhering the adhesive layer 180 positioned at the edge of the transfer region "A" to the pixel defining layer 170, the transfer region "A" of the transfer layer 330 is completely separated from the peripheral transfer layer 330 near the transfer region "A" by the adherence. Accordingly, the uncompleted separation of the transfer region "A" from the periphery of the transfer layer 330 may be reduced.

Referring to FIG. 7, an opening "C" is formed in the adhesive layer 340. The opening "C" may be formed with a shape corresponding to the pixel area "D". For example, when the pixel area "D" is rectangular, the opening "C" may be rectangular. The transfer layer 330 is exposed by the opening "C" of the adhesive layer 340.

The opening "C" is formed to be equal to or larger than the area of the pixel area "D". When the opening "C" is the same as the above area, as shown in FIG. 7, the transfer layer 330 may be positioned on the pixel defining layer 170.

Also, the adhesive layer 340 may be formed with a ring shape with the opening "C" formed at the center. That is, when viewing the donor substrate 300 in the vertical direction, the adhesive layer 340 is formed with a donut shape having a predetermined width according to the circumference of the opening "C".

The adhesive layer 340 may be formed on the transfer layer 330 by using a mask. The mask may be an exposure mask or a fine metal mask.

Here, the adhesive layer 340 is made of a material having an adhesion force or an attachable/detachable force. That is, the adhesive layer 340 is made of an adhesive or attachable/detachable material.

When the adhesive layer 340 is formed of the adhesive material, the adhesive layer 340 may be formed of the heat-hardening or the light-hardening material.

Referring to FIG. 6, the transfer layer 330 is transferred into the transfer region "A" inside the external circumferential surface of the adhesive layer 340.

According to the organic light emitting diode (OLED) display, the manufacturing method of the light emitting diode (OLED) display, and the donor substrate according to an embodiment of the present invention, by completely separating the transfer layer of the donor substrate irradiated by the laser from the donor substrate, the transferring defect in which the transfer layer of the transfer region is not wholly transferred but partially remains at the donor substrate may be prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
   a substrate;
   a thin film transistor formed on the substrate;
   a pixel electrode formed on the thin film transistor and electrically connected to the thin film transistor;
   a pixel defining layer formed on the pixel electrode and having a plurality of openings that are individually formed for each pixel and defining a pixel area;
   an emission layer formed on the pixel electrode and formed for each opening formed by the pixel defining layer and contacting the pixel electrode in the pixel area; and
   an intermediate layer formed on the pixel defining layer and contacting a portion of the emission layer, wherein the intermediate layer comprises an attachable/detachable material.

2. The organic light emitting diode (OLED) display device of claim 1, wherein the intermediate layer further comprises an adhesive material.

3. The organic light emitting diode (OLED) display device of claim 2, wherein the adhesive material is a heat-hardening material or a light-hardening material.

4. The organic light emitting diode (OLED) display device of claim 1, wherein the intermediate layer is formed along an edge of the emission layer.

5. The organic light emitting diode (OLED) display device of claim 4, wherein the intermediate layer is formed with a ring shape.

6. The organic light emitting diode (OLED) display device of claim 1, wherein the emission layer covers the intermediate layer and the pixel electrode of the pixel area.

7. The organic light emitting diode (OLED) display device of claim 6, wherein the emission layer covers a portion of the intermediate layer.

8. The organic light emitting diode (OLED) display device of claim 1, wherein the intermediate layer covers a portion of the pixel defining layer.

9. A donor substrate for an organic light emitting diode (OLED) display device, comprising:
   a substrate disposed to transfer a transfer material to a pixel area defined by a pixel defining layer of an organic light emitting diode (OLED) display device, the donor substrate comprising:
   a base layer;
   a light-to-heat conversion layer formed on the base member;
   a transfer layer formed on the light-to-heat conversion layer and made of an organic emission material; and
   an adhesive layer formed on the transfer layer and including an opening of a shape corresponding to the pixel area, wherein
   the adhesive layer comprises an attachable/detachable material.

10. The donor substrate of claim 9, wherein the opening is equal to or larger than an area of the pixel area.

11. The donor substrate of claim 9, wherein the adhesive layer is formed of a ring shape.

12. The donor substrate of claim 9, wherein the adhesive layer further comprises an adhesive material.

13. The donor substrate of claim 12, wherein the adhesive material is a heat-hardening material or a light-hardening material.

14. The organic light emitting diode (OLED) display device of claim 1, further comprising a buffer later formed by any one of a silicon nitride (SiNx) layer, a silicon oxide ($SiO_2$) layer, and a silicon oxynitride (SiOxNy) layer.

15. The organic light emitting diode (OLED) display device of claim 1, wherein the thin film transistor comprise a channel area, a source area, and a drain area, and the source area and the drain area are doped with a p-type impurity.

16. The organic light emitting diode (OLED) display device of claim 1, further comprising a planarization layer formed on the thin film transistor, and the planarization layer comprises at least one material of acryl-based resins, epoxy resins, phenolic resins, polyamide-based resins, polyimide-based resins, unsaturated polyester-based resins, polyphenylenether-based resins, polyphenylenesulfide-based resins, and benzocyclobutene (BCB).

17. The donor substrate of claim 9, wherein the base layer is made of at least one polymer material selected from polyester, polyacryl, polyepoxy, polyethylene, polystyrene, and polyethylene terephthalate, or of glass.

18. The donor substrate of claim 9, wherein the light-to-heat conversion layer is a metal film made of Al, Ag, or their oxides and sulfides, or an organic film made of a polymer including carbon black, graphite, or an infrared dye.

* * * * *